US007318992B2

(12) United States Patent
Kawana et al.

(10) Patent No.: US 7,318,992 B2

(45) **Date of Patent: *Jan. 15, 2008**

(54) LIFT-OFF POSITIVE RESIST COMPOSITION

(75) Inventors: Daisuke Kawana, Kawasaki (JP); Tomotaka Yamada, Kawasaki (JP); Hiroshi Shimbori, Kawasaki (JP); Koki Tamura, Kawasaki (JP); Tomoyuki Ando, Kawasaki (JP); Takayuki Hosono, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 229 days.

This patent is subject to a terminal disclaimer.

(21) Appl. No.: 11/091,666

(22) Filed: Mar. 28, 2005

(65) Prior Publication Data

US 2005/0227171 A1 Oct. 13, 2005

(30) Foreign Application Priority Data

Mar. 31, 2004 (JP) ........................ P 2004-102046

(51) Int. Cl.
*G03F 7/039* (2006.01)

(52) U.S. Cl. .............................. 430/270.1; 430/271.1; 430/314; 430/316; 430/319; 430/318

(58) Field of Classification Search ..................... None
See application file for complete search history.

(56) References Cited

U.S. PATENT DOCUMENTS 5,691,396 A * 11/1997 Takemura et al. ............ 522/62
6,670,100 B1 * 12/2003 Hasegawa et al. ....... 430/284.1
2003/0060055 A1 3/2003 Kamijima
2004/0229161 A1 * 11/2004 Yasunami et al. ....... 430/270.1
2005/0244745 A1 * 11/2005 Cameron et al. ........ 430/270.1

FOREIGN PATENT DOCUMENTS

| | | | |
|---|---|---|---|
| JP | 03-139650 A | * | 6/1991 |
| JP | 04-130324 | | 5/1992 |
| JP | 06-118651 A | * | 4/1994 |
| JP | 2002-110536 | | 4/2002 |
| JP | 1 643 307 A1 | * | 4/2006 |
| WO | WO2004/111734 A1 | * | 12/2004 |

OTHER PUBLICATIONS

Ferreira et al, "Choice of amines as stabilizers for cheimcally amplified resist systems", Proceedings of SPIE, vol. 333, Advances in Resist TEchnology and Processing XV, Will Conley, Ed, Jun. 1998, pp. 236-244.*

* cited by examiner

*Primary Examiner*—Cynthia Hamilton
(74) *Attorney, Agent, or Firm*—Knobbe Martens Olson & Bear LLP

(57) ABSTRACT

A lift-off positive resist composition capable of forming a fine lift-off pattern is provided. This composition comprises a base resin component (A) and an acid generator component (B) generating an acid under exposure, wherein the base resin component (A) is a silicone resin.

12 Claims, 1 Drawing Sheet

LIFT-OFF POSITIVE RESIST COMPOSITION

BACKGROUND OF THE INVENTION

1. Field of the Invention

The present invention relates to a lift-off positive resist composition.

This application claims priority from Japanese Patent Application No. 2004-102046 filed on Mar. 31, 2004, the disclosure of which is incorporated by reference herein.

2. Description of the Related Art

In the production of semiconductor devices and light crystal display devices, a fine working technique based on a lithography technique is used. A three-dimensional fine working technique employing the lithography technique is referred to as micromachining and is used in the production of high-grade portable systems in which various elements such as sensors, circuits and fine structures are integrated on a substrate, for example, so-called MEMS and MRAM.

As one of applications of such a lithography technique, a lift-off method is exemplified. For example, the lift-off method is used in the production of fine structures in the lead portion (head portion for read-out) of a magnetic head of a magnetic recording medium (see, for example, Patent Document 1).

In FIG. 1A to FIG. 1E, schematic views (side sectional views) showing the respective steps of forming a magnetic head are shown.

First, as shown in FIG. 1A, a magnetic film 2' is laminated on a substrate 1, and then a base film 3', which is soluble in an alkali developer solution, and a resist film 4' are sequentially laminated thereon.

The resist film 4' is subjected to selective exposure via a mask pattern using a KrF excimer laser. When alkali development is conducted, a predetermined range (the exposed area in the case of a positive one, or the non-exposed area in the case of a negative one) of the resist film 4' is dissolved and removed to obtain a resist pattern 4. At this time, the base film 3' located under the removed portion of the resist film 4' is also removed with an alkali developer solution to form a base pattern 3; however, the base film 3' usually has alkali solubility higher than that of the resist film 4', and the width $W^1$ of the base pattern 3 is smaller than the width $W^2$ of the resist pattern 4. Due to a difference in dissolution rate, as shown in FIG. 1B, a lift-off pattern 5 having a battledore-shaped profile comprising a base pattern 3 having a small width and a resist pattern 4 having a larger width can be obtained.

When ionic etching is conducted using the lift-off pattern 5 as a mask, as shown in FIG. 1C, the magnetic film 2' around the lift-off pattern 5 is etched to form a magnetic film pattern 2 under and around the lift-off pattern 5. Ion milling is often used as ionic etching.

When sputtering is further conducted, as shown in FIG. 1D, an electrode film 6 is formed on the lift-off pattern 5 and the substrate 1 around the magnetic film pattern 2.

Finally, the base pattern 3 is dissolved by using an alkali developer solution to remove the resist pattern 4, and thus the lift-off pattern 5 is removed (lifted-off). Due to lifing-of the lift-off pattern 5, as shown in FIG. 1E, a magnetic head 10 comprising a substrate 1, a magnetic film pattern 2 having a predetermined width formed on the substrate, and an electrode film 6 formed around the substrate is obtained.

Patent Document 1: Japanese Patent Application, First Publication No. 2002-110536

Currently, demands for fine working have increased more and more. For example, it is required to attain fine working of a magnetic head so as to improve recording density of a magnetic recording medium. Also, it is required to form a fine resist pattern (Iso pattern) thereby to form a fine magnetic film pattern so as to attain fine working of the magnetic head.

However, a conventionally used positive resist composition has a problem that a fine lift-off pattern cannot be formed because sufficient fine working cannot be performed.

As one of techniques of performing fine working, fine working of a resist film is proposed. However, a conventionally used positive resist composition has a problem that, because of insufficient resistance to ionic etching such as ion milling, thickness loss of the resist film occurs and rectangularity of the resist pattern becomes worse, and thus the substrate and the magnetic film cannot be sufficiently etched.

There also arises a problem that fine control of the size of the width $W^1$ (see FIG. 1B) of the base pattern 3 in the case of formation of a lift-off pattern is conducted with difficulty and the base pattern 3 becomes too thin due to over-etching causing pattern falling.

SUMMARY OF THE INVENTION

The present invention has been made so as to solve the problems described above, and an object of thereof is to provide a lift-off positive resist composition capable of forming a fine lift-off pattern.

The present inventors have intensively resurched and found that the above problems can be solved by a positive resist composition containing a silicone resin as a base resin, and thus the present invention has been completed.

The present invention is directed to a lift-off positive resist composition comprising a base resin component (A) and an acid generator component (B) generating an acid under exposure, wherein the base resin component (A) is a silicone resin.

In the present invention, the "constituent unit" means a monomer unit constituting a polymer. Exposure also includes irradiation with an electron beam.

According to the lift-off positive resist composition of the present invention, a fine lift-off pattern can be formed.

DESCRIPTION OF THE PREFERRED EMBODIMENTS

Figure 1A:
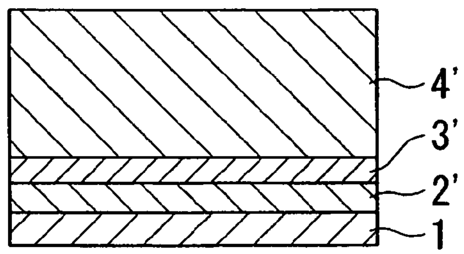
FIGS. 1A to 1E are schematic views for explaining the step of forming a magnetic film pattern using a lift-off method.

The present invention will now be described in more detail.

The lift-off positive resist composition of the present invention comprises a base resin component (A) (which hereinafter may be referred to as component (A)) and an acid generator component (B) generating an acid under exposure (which hereinafter may be referred to as component (B)).

In the positive resist composition, when an action of the acid generated from the component (B) is exerted, the entire positive resist composition, which is insoluble in an alkali, becomes soluble in an alkali. Therefore, when the positive resist composition applied onto a substrate is selectively exposed via a mask pattern in the formation of a resist pattern, alkali solubility of the exposed area increases, and thus alkali development can be attained.

The positive resist composition of the present invention is used for a lift-off method. For example, as described in the item "Method for formation of lift-off pattern and patterning method" described hereinafter, the positive resist composition is preferably used for a method for formation of a lift-off pattern having a battledore-shaped structure, including a base pattern and a resist pattern having a width larger than that of the base pattern, the method including forming a resist film on a substrate or a magnetic film provided on the substrate via a base film, selectively exposing the resist film, subjecting to alkali development to form a resist pattern, and performing over etching of the base film by dry etching such as oxygen plasma etching using the resist pattern as a mask to form a base pattern.

For example, the lift-off pattern thus formed is used for a patterning method including performing ionic etching such as ion milling using the lift-off pattern as a mask to form a pattern on the substrate or magnetic film, and optionally forming a thin film by sputtering, thereby to remove (lift-off) the lift-off pattern.

(Component (A))

A feature of the positive resist composition of the present invention is that the component (A) is a silicone resin.

The silicone resin is a resin having an organic group such as an alkyl group or aryl group among polysiloxanes having a repeating structure of a siloxane bond in which a silicon atom and an oxygen atom are combined.

As the silicone resin, a silicone resin proposed as a base resin of a positive resist composition can be generally used and includes, for example, a silsesquioxane resin having a constituent unit in which one silicon atom is combined with 3/2 oxygen atoms and one organic group.

In the present invention, when the component (A) is a silicone resin, it becomes possible to form a fine lift-off pattern. According to the method of the prior art, in the case of a resist film is formed on an alkali soluble organic film (base film) and is subjected to over-etching after exposure to form a lift-off pattern, the development of the resist film and excessive dissolution of the base film in an alkali are simultaneously conducted by the alkali development to form a lift-off pattern. However, according to such a method, fine control of the size of the resist pattern and the base pattern is conducted with difficulty during the development. In contrust, according to the method of the present invention, by using the resist composition containing a silicone resin, resistance of the resist film to dry etching is enhanced and dry etching capable of easily controlling the size of the base film due to over-etching can be utilized, and thus a fine lift-off pattern can be formed. Since a conventional resist film is inferior in resistance to dry etching such as oxygen etching, dry etching cannot be used.

In the present invention, the content (silicon content) of a silicon atom derived from the component (A) is preferably from 5 to 30% by weight, and more preferably from 8 to 20% by weight, based on the total solid content of the positive resist composition. When the content is not less than the lower limit, resistance to dry etching such as oxygen plasma etching becomes sufficient to form a fine lift-off pattern. On the other hand, when the content is not more than the upper limit, good quantitative balance with the other components (final, balance between various properties) is attained.

The silicon content can be adjusted by adjusting the silicon content of the silicone resin used as the component (A) and/or the amount of the component (A) in the positive resist composition.

In the present invention, the component (A) includes a resin component (A1) having an acid dissociable dissolution inhibiting group, the dissolution inhibiting group being dissociated by an action of an acid thereby to enhance alkali solubility, and an alkali soluble resin component (A2).

In the case in which the component (A) is the resin component (A1), the acid dissociable dissolution inhibiting group contained in the resin component (A1) is dissociated by the acid generated from the component (B), thereby to enhance alkali solubility of the exposed area.

In the case in which the component (A) is the resin component (A2), the positive resist composition of the present invention contains below-mentioned low molecular weight dissolution inhibitor (C) having an acid dissociable dissolution inhibiting group, the acid dissociable dissolution inhibiting group being dissociated by an action of an acid. That is, the acid dissociable dissolution inhibiting group contained in the low molecular weight dissolution inhibitor (C) is dissociated by the acid generated from the component (B), thereby to enhance alkali solubility of the exposed area.

Preferable examples of the resin component (A1) include the following silsesquioxane resin (A11) and silsesquioxane resin (A12).

Preferable examples of the resin component (A2) include the following silsesquioxane resin (A21).

(Silsesquioxane Resin (A11))

The silsesquioxane resin (A11) includes a constituent unit (a1) represented by the following general formula (I):

(I)

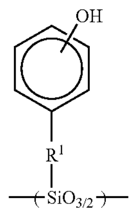

wherein $R^1$ represents a linear or branched alkylene group having 1 to 5 carbon atoms, a constituent unit (a2) represented by the following general formula (II):

(II)

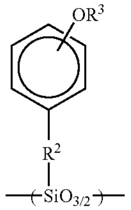

wherein $R^2$ represents a linear or branched alkylene group having 1 to 5 carbon atoms, and $R^3$ represents an acid dissociable dissolution inhibiting group, and a constituent unit (a3) represented by the following general formula (III):

(III)

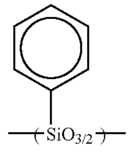

In the constituent unit (a1), $R^1$ is preferably a lower alkylene group having 1 to 5 carbon atoms, and is more preferably a methylene group in view of the synthesis of the resin. The position of the hydroxyl group may be any of the o-, m- and p-positions, and is preferably the p-position from industrial points of view.

In the constituent unit (a2), $R^2$ is also preferably a lower alkylene group having 1 to 5 carbon atoms, and more preferably a methylene group in view of the synthesis of the resin.

In the constituent unit (a2), $R^3$ is preferably an acid dissociable dissolution inhibiting group.

In the present invention, the term "acid dissociable dissolution inhibiting group" is a group which has alkali dissolution inhibiting properties capable of making the entire positive resist composition insoluble in an alkali before exposure, and which is dissociated due to an action of an acid generated from the component (B), thereby making the entire positive resist composition soluble in an alkali, in the process for formation of a resist pattern using the positive resist composition.

Therefore, when the resist composition containing the silsesquioxane resin (A11) is applied onto a substrate and then exposed via a mask pattern, alkali solubility of the exposed area enhances and thus a resist pattern can be formed by alkali development.

$R^3$ may be an acid dissociable dissolution inhibiting group which can be substituted with a hydrogen atom of a phenolic hydroxyl group, and can be appropriately elected from various groups according to a light source to be used. Specific examples thereof include tertiary alkyloxycarbonyl groups such as tert-butoxycarbonyl group and tert-amyloxycarbonyl group; tertiary alkyl groups such as tert-butyl group and tert-amyl group; tertiary alkoxycarbonylalkyl groups such as tert-butoxycarbonylmethyl group and tert-butoxycarbonylethyl group; alkoxyalkyl groups such as 1-ethoxyethyl group, 1-isopropoxyethyl group, 1-methoxy-1-methylethyl group, 1-methoxypropyl group and 1-n-butoxyethyl group; and cyclic ether groups such as tetrahydropyranyl group and tetrahydroalanyl group.

Among these groups, an alkoxyalkyl group is preferable because elimination energy is low and dissolution contrast can be obtained with ease, thus making it possible to improve lithography characteristics. The number of carbon atoms of an alkoxy group in the alkoxyalkyl group is preferably from 1 to 3, and the number of carbon atoms of an alkyl group is preferably from 1 to 6. The alkoxyalkyl group is preferably a 1-ethoxyethyl group.

The position of —$OR^3$ may be any of the o-, m- and p-positions, and is preferably the p-position from industrial points of view.

The silsesquioxane resin (A11) may contain a constituent unit (a4), which does not adversely affect the effects of the present invention, in addition to the constituent units (a1) to (a3).

Specific examples of the constituent unit (a4) include a constituent unit represented by the following general formula (VI):

(IV)

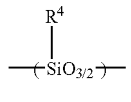

wherein $R^4$ represents a linear, branched or cyclic alkyl group having 1 to 15 carbon atoms.

With respect to the content of each constituent unit in the resin, the total content of the constituent units (a1) and (a2) is preferably 50% by mole or more based on the total amount of all constituent units of the silsesquioxane resin (A11). When the total content of the constituent units (a1) and (a2) is less than 50% by mole, solubility in the alkali developing step may be insufficient.

The constituent unit (a3) is a constituent unit which contributes to an improvement in heat resistance. When the content of the constituent unit (a3) in the silsesquioxane resin (A11) is less than 10%, sufficient effect of improving heat resistance may not be exerted. Therefore, the total content of the constituent units (a1) and (a2) is preferably 90% by mole or less.

Therefore, the total content of the constituent units (a1) and (a2) is preferably from 50 to 90% by mole, and more preferably from 60 to 80% by mole. The content of the constituent unit (a3) is preferably from 10 to 50% by mole, and more preferably 20 to 40% by mole.

The content of the constituent unit (a2) is preferably 8% by mole or more based on the total amount of the constituent units (a1) and (a2).

The smaller the content of the constituent unit (a2) based on the total amount of the constituent units (a1) and (a2), the more the dissolution inhibiting effect due to introduction of the acid dissociable dissolution inhibiting group ($R^3$) decreases. Therefore, a change in alkali solubility before and after the exposure of the silsesquioxane resin (A11) decreases. On the other hand, when the content of the constituent unit (a2) is too large, a portion of the acid dissociable dissolution inhibiting groups may remain without being completely dissociated after passing through the exposure and PEB steps. The acid dissociable dissolution inhibiting groups remained without being completely dissociated may not be removed by rinsing, thereby causing defects. When the content of the constituent unit (a2) is large, heat resistance of the component (A) may be lowered.

Therefore, the content of the constituent unit (a2) is preferably from about 8 to 25% by mole, and more preferably from about 10 to 20% by mole, based on the total amount of the constituent units (a1) and (a2).

If the shape of the desired resist pattern is a line-and-space pattern, larger content of the constituent unit (a3) in the silsesquioxane resin (A11) improves line edge roughness, and thus the resulting resin (A11) is suited for fine working. In this case, the content of the constituent unit (a3) is preferably from 25 to 50% by mole, and more preferably from 30 to 40% by mole. The term "line edge roughness" as used herein refers to irregularity of the line side wall. 3σ as a measure of line edge roughness of the line-and-space pattern is a triple value (3σ) of a standard deviation (σ) calculated from the results of the measurement of the width of the resist pattern of samples at 32 positions using a measuring SEM (manufactured by Hitachi, Ltd. under the trade name of "S-9220"). The smaller the value of 3σ, the less roughness and more uniform width the resulting resist pattern may have.

If the shape of the desired resist pattern is a hole pattern, when the content of the constituent unit (a3) in the silsesquioxane resin (A11) is large, edge roughness of the hole pattern is improved; however, definition may be lowered. Therefore, the content of the constituent unit (a3) is preferably from 25 to 35% by mole, and more preferably from 25 to 30% by mole.

When the silsesquioxane resin (A11) contains the other constituent unit (a4), the content is preferably 25% by mole or less, and more preferably 15% by mole or less.

The constituent unit (a3) or the constituent units (a3) and (a4) preferably constitutes the remainder other than the constituent unit (a1) and (a2) in the silsesquioxane resin (A11), that is, 50% by mole or less. The silsesquioxane resin (A11) is preferably composed of only the constituent units (a1) to (a3) or the constituent units (a1) to (a4).

Polystyrene equivalent weight average molecular weight (Mw) determined using gel permeation chromatography (which hereinafter may be abbreviated as GPC) of the silsesquioxane resin (A11) is not specifically limited, but is preferably within a range from 2000 to 15000, and more preferably from 5000 to 10000. When the weight average molecular weight is more than the above range, solubility in an organic solvent may become worse. On the other hand, when the weight average molecular weight is less than the above range, a resist pattern profile may be degraded.

The ratio Mw/number average molecular weight (Mn) is not specifically limited, but is preferably within a range from 1.0 to 6.0, and more preferably from 1.0 to 2.0. When the ratio is above the above range, resolution and pattern shape may be degraded.

As shown in the synthesis examples described hereinafter, the silsesquioxane resin (A11) in the present invention can be produced, for example, by obtaining a polymer including constituent units (a1) and (a3) or a polymer including constituent units (a1), (a3) and (a4) using the method described in Japanese Patent No. 2,567,984, and substituting a hydrogen atom of a phenolic hydroxyl group in a portion of the side chain of the constituent unit (a1) with an acid dissociable dissolution inhibiting group to form a constituent unit (a2) using a well-known technique. As the monomer of the constituent unit (a4), alkyltrialkoxysilane or alkyltrichlorosilane can be used.

In the step of introducing an acid dissociable dissolution inhibiting group, a polymer including constituent units (a1), (a2) and (a3) or a polymer including constituent units (a1), (a2), (a3) and (a4) can be obtained by dissolving the above polymer in an organic solvent, adding a base or acid catalyst, and a compound corresponding to the acid dissociable dissolution inhibiting group, reacting the polymer solution at a temperature of about 20 to 70° C. for about 1 to 10 hours, adding an acid or base to the reaction solution, thereby to neutralize the reaction, and pouring the reaction solution into water with stirring to deposit a polymer. The base or acid catalyst may be used properly according to the compound corresponding to the acid dissociable dissolution inhibiting group.

The content of the constituent units (a1) and (a2) can be controlled according to the amount of the compound corresponding to the acid dissociable dissolution inhibiting group to be introduced.

(Silsesquioxane Resin (A12))

The silsesquioxane resin (A12) includes a constituent unit (a1) represented by the above general formula (I) and a constituent unit (a5) represented by the following general formula (V):

(V)

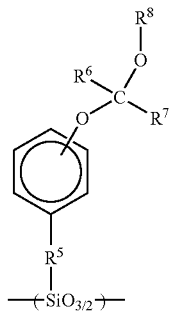

wherein $R^5$ represents a linear or branched alkylene group having 1 to 5 carbon atoms, $R^6$ represents an alkyl group having 1 to 5 carbon atoms, $R^7$ represents an alkyl group having 1 to 5 carbon atoms or a hydrogen atom, and $R^8$ represents an alicyclic hydrocarbon group having 5 to 15 carbon atoms.

In the silsesquioxane resin (A12), $R^1$ of the constituent unit (a1) is preferably a linear or branched alkylene group having 1 to 5 carbon atoms, and more preferably a linear or branched alkylene group having 1 to 3 carbon atoms, in view of the synthesis of the resin. The position of the hydroxyl group may be any of the o-, m- and p-positions, and is preferably the p-position from industrial points of view.

In the constituent unit (a5), similar to $R^1$, $R^5$ is preferably a linear or branched alkylene group having 1 to 5 carbon atoms, and more preferably a linear or branched alkylene group having 1 to 3 carbon atoms, in view of the synthesis of the resin.

$R^6$ is preferably a linear or branched alkyl group having 1 to 5 carbon atoms, and more preferably a methyl group or an ethyl group.

$R^7$ is preferably a linear or branched alkyl group having 1 to 5 carbon atoms or a hydrogen atom, and more preferably a hydrogen atom.

$R^8$ is preferably an alicyclic hydrocarbon group having 5 to 15 carbon atoms, more preferably a cycloalkyl group having 5 to 7 carbon atoms such as a cyclopentyl group or a cyclohexyl group, and most preferably a cyclohexyl group from industrial points of view because it is inexpensive.

The functional group represented by the following general formula (VI) in the constituent unit (a5) functions as the acid dissociable dissolution inhibiting group.

Therefore, when a resist composition containing the silsesquioxane resin (A12) is applied onto a substrate and then exposed via a mask pattern, alkali solubility of the exposed area is enhanced, and thus a resist pattern can be formed by alkali development.

(VI)

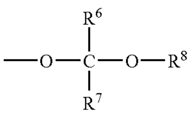

The position of the acid dissociable dissolution inhibiting group represented by the general formula (VI) may be any of the o-, m- and p-positions, and is preferably the p-position from industrial points of view.

With respect to the content of each constituent unit in the resin, the total content of the constituent units (a1) and (a5) is preferably 50% by mole or more based on the total amount of all constituent units of the silsesquioxane resin (A12), and may be 100% by mole. When the total content of the constituent units (a1) and (a5) is less than 50% by mole, solubility in the alkali developing step may be insufficient. Therefore, the total content of the constituent units (a1) and (a5) is preferably from 50 to 90% by mole, and more preferably from 60 to 80% by mole.

The content of the constituent unit (a5) is preferably from 5 to 50% by mole, and 25 more preferably from 5 to 15% by mole, based on the total amount of the constituent units (a1) and (a5). The smaller the content of the constituent unit (a5) based on the total amount of the constituent units (a1) and (a5), the more the dissolution inhibiting effect due to introduction of the acid dissociable dissolution inhibiting group decreases. Therefore, a change in alkali solubility before and after the exposure of the silsesquioxane resin (A12) decreases. On the other hand, when the content of the constituent unit (a5) is too large, a portion of the acid dissociable dissolution inhibiting groups may be remained without being completely dissociated after passing through the exposure and PEB steps. The acid dissociable dissolution inhibiting groups remaining without being completely dissociated may not be removed by rinsing, thereby to cause defects. When the content of the constituent unit (a5) is large, heat resistance of the component (A) may be lowered.

The silsesquioxane resin (A12) may further contain a constituent unit (a3) represented by the general formula (III).

The constituent unit (a3) is not essential. However, when the silsesquioxane resin (A12) contains the constituent unit (a3), heat resistance of the resist pattern is improved.

If the shape of the desired resist pattern is a line-and-space pattern, line edge roughness is effectively improved when the silsesquioxane resin (A12) contains the constituent unit (a3). In this case, the content of constituent unit (a3) in the silsesquioxane resin (A12) is preferably from 20 to 50% by mole, and more preferably from 30 to 40% by mole.

The silsesquioxane resin (A12) may contain, in addition to the constituent units (a1), (a5) and (a3), the above-mentioned constituent unit (a4) which does not adversely affect the effects of the present invention.

When the silsesquioxane resin (A12) contains the above or other constituent unit (a4), the content is preferably 20% by mole or less, and more preferably 15% by mole or less.

The constituent unit (a3) or the constituent units (a3) and (a4) preferably constitutes the remainder other than the constituent unit (a1) and (a5) in the silsesquioxane resin (A12), that is, 50% by mole or less. The silsesquioxane resin (A12) is preferably composed of only the constituent units (a1), (a5) and (a3) or the constituent units (a1), (a5), (a3) and (a4).

The weight average molecular weight (Mw) of the silsesquioxane resin (A12) is not specifically limited, but is preferably within a range from 2000 to 15000, and more preferably from 5000 to 10000. When the weight average molecular weight is above the above range, solubility in an organic solvent may become worse. On the other hand, when the weight average molecular weight is below the above range, a resist pattern profile may become worse.

The ratio Mw/Mn is not specifically limited, but is preferably within a range from 1.0 to 6.0, and more preferably from 1.0 to 2.0. When the ratio is more than the above range, resolution and pattern shape may become worse.

When silsesquioxane resin (A12) in the present invention includes constituent units (a1) and (a5), it can be produced, for example, by obtaining a polymer including a constituent unit (a1) using a well-known polymerization method, and introducing an acid dissociable dissolution inhibiting group into a phenolic hydroxyl group in a portion of the side chain of the constituent unit (a1) to form a constituent unit (a5) using a well-known technique.

The silsesquioxane resin including constituent units (a1), (a5) and (a3) can be produced, for example, by obtaining a polymer including constituent units (a1) and (a3), as shown in synthesis examples described hereinafter, using the method described in Japanese Patent No. 2,567,984, and introducing an acid dissociable dissolution inhibiting group into a phenolic hydroxyl group in a portion of the side chain of the constituent unit (a1) using a well-known technique.

The silsesquioxane resin including constituent units (a1), (a5), (a3) and (a4) can be produced, for example, by obtaining a polymer including constituent units (a1), (a3) and (a4), and introducing an acid dissociable dissolution inhibiting group (VI) into a phenolic hydroxyl group in a portion of the side chain of the constituent unit (a1) using a well-known technique. As the monomer of the constituent unit (a4), alkyltrialkoxysilane or alkyltrichlorosilane can be used.

In the step of introducing the acid dissociable dissolution inhibiting group (VI), a polymer including the above respective constituent units and a constituent unit (a5) can be obtained by dissolving the polymer including the constituent unit (a1), the polymer including the constituent units (a1) and (a3) or the polymer including the constituent units (a1), (a3) and (a4) in an organic solvent, adding a base or acid catalyst, and a compound corresponding to the acid dissociable dissolution inhibiting group (VI) to be introduced, reacting the polymer solution at a temperature of about 20 to 70° C. for about 1 to 10 hours, adding an acid or base to the reaction solution, thereby to neutralize the reaction, and pouring the reaction solution into water with stirring to deposit a polymer. The base or acid catalyst may be used properly according to the compound corresponding to the acid dissociable dissolution inhibiting group.

The content of the constituent unit (a5) can be controlled by the amount of the compound corresponding to the acid dissociable dissolution inhibiting group to be introduced.

(Silsesquioxane Resin (A21))

The silsesquioxane resin (A21) includes a constituent unit (a1) represented by the above general formula (I), a constituent unit (a7) represented by the following general formula (VII):

(VII)

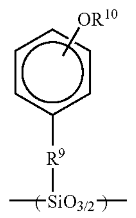

wherein $R^9$ represents a linear or branched alkylene group having 1 to 5 carbon atoms, and $R^{10}$ represents a linear or branched alkyl group having 1 to 5 carbon atoms, and a constituent unit (a3) represented by the above general formula (III).

In the general formula (VII), similar to $R^1$, $R^9$ is preferably a linear or branched alkylene group having 1 to 5 carbon atoms, and more preferably a linear or branched alkylene group having 1 to 3 carbon atoms, in view of the synthesis of the resin.

$R^{10}$ is most preferably a methyl group.

The position of $—OR^{10}$ in the general formula (VII) may be any of the o-, m- and p-positions, and is preferably the p-position from industrial points of view.

With respect to the content of these constituent units, the content of the constituent unit (a1) is preferably selected within a range from 10 to 70% by mole, and more preferably from 20 to 55% by mole; the content of the constituent unit (a7) is preferably selected within a range from 5 to 50% by mole, and more preferably from 10 to 40% by mole; and the constituent unit (a3) is preferably selected within a range from 10 to 60% by mole, and more preferably from 20 to 40% by mole.

The constituent unit (a7) has a function of adjusting solubility in an alkali, thereby to inhibit thickness loss and to prevent roundness of a resist pattern profile. It is advantageous when this constituent unit (a7) can be introduced with ease by inhibiting the dissociation degree of the alkoxy group because it is made from the same starting material as that of the constituent unit (a1).

The silsesquioxane resin (A21) may contain, in addition to the constituent units (a1), (a7) and (a3), the above-mentioned constituent unit (a4) which does not adversely affect the effects of the present invention.

When the silsesquioxane resin (A21) contains the above or other constituent unit (a4), the content is preferably 20% by mole or less, and more preferably 15% by mole or less.

In the positive resist composition of the present invention, the rate of the silsesquioxane resin (A21) dissolved in an alkali may be adjusted from 0.05 to 50 nm/sec, and preferably 5.0 to 30 nm/sec, by adjusting the content of the constituent unit (a7) in the silsesquioxane resin (A21).

As used herein, the rate of the silsesquioxane resin (A21) dissolved in the alkali is a rate of dissolution in an aqueous 2.38 wt % TMAH (tetramethylammonium hydroxide) solution.

By adjusting to the dissolution rate of 50 nm/sec or less, thickness loss can be sufficiently inhibited and roundness of the resist pattern profile can be prevented. Also the effect of improving definition and reducing defects can be exerted. By adjusting to the dissolution rate of 0.05 nm/sec or more, a resist can be obtained by dissolving in an organic solvent.

The dissolution rate can be adjusted by changing the content of the constituent unit (a7). For example, the dissolution rate can be decreased by increasing the content of the constituent unit (a7).

The rate of dissolution in the alkali is determined by the following procedure.

First, a solution prepared by dissolving the silsesquioxane resin (A21) in an organic solvent is applied onto a silicon wafer and the organic solvent is vaporized by a heating treatment (prebaking (PAB)) to form a resin coating film (thickness: 500 to 1300 nm, for example, thickness: 1000 nm). The organic solvent is appropriately selected from known organic solvents used in a chemically amplified photoresist composition as described hereinafter. The content of the silsesquioxane resin (A21) may be the same as that of the base resin in the resist, but is from 10 to 25% by weight, for example, 20% by weight. After measuring the thickness of the resin coating film, the wafer is immersed in an aqueous 2.38 wt % TMAH solution at 23° C. The time required to completely dissolve the resin film is measured and then thickness loss per unit time (nm/second) of the resin coating film is determined from the resulting time.

The resulting thickness loss of the resin coating film is a dissolution rate of the silsesquioxane resin (A21).

The weight average molecular weight (Mw) of the silsesquioxane resin (A21) is not specifically limited, but is preferably within a range from 1500 to 20000. When the weight average molecular weight is more than the above range, solubility in an organic solvent may decrease. On the other hand, when the weight average molecular weight is less than the above range, a resist pattern profile may be decreased.

The ratio Mw/Mn is not specifically limited, but is preferably within a range from 1.0 to 6.0, and more preferably from 1.0 to 2.0. When the ratio is more than the above range, resolution and pattern shape may become worse.

(Component (B))

In the present invention, the component (B) may be used from known acid generators used in a conventional chemically amplified resist without any limitation. As the acid generator, there are known various acid generators, for example, onium salt-based acid generators such as iodonium salt and sulfonium salt; oxime sulfonate-based acid generators; diazomethane-based acid generators such as bisalkyl or bisarylsulfonyldiazomethanes, poly(bissulfonyl)diazomethanes, and diazomethanenitrobenzyl sulfonates; iminosulfonate-based acid generators; and disulfone-based acid generator.

Specific examples of the onium salt-based acid generator include trifluoromethane sulfonate or nonafluorobutane sulfonate of phenyliodonium, trifluoromethane sulfonate or nonafluorobutane sulfonate of bis(4-tert-butylphenyl)iodonium, trifluoromethane sulfonate of triphenylsulfonium or its heptafluoropropane sulfonate or its nonafluorobutane sulfonate, trifluoromethane sulfonate of tri(4-methylphenyl) sulfonium or its heptafluoropropane sulfonate or its nonafluorobutane sulfonate, trifluoromethane sulfonate of (4-methylphenyl)diphenylsulfonium or its heptafluoropropane sulfonate or its nonafluorobutane sulfonate, trifluoromethane sulfonate of (4-methoxyphenyl)diphenylsulfonium or its heptafluoropropane sulfonate or its nonafluorobutane sulfonate, trifluoromethane sulfonate of dimethyl(4-hydroxynaphthyl)sulfonium or its heptafluoropropane sulfonate or its nonafluorobutane sulfonate, and trifluoromethane sulfonate of monophenyldimethylsulfonium or its heptafluoropropane sulfonate or its nonafluorobutane sulfonate. Among these, an onium salt containing a fluorinated alkylsulfonic acid ion as an anion is preferable.

Specific examples of the oxime sulfonate-based acid generator include α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, α-(methylsulfonyloxyimino)-p-bromophenylacetonitrile and bis-O-(n-butylsulfonyl)-α-dimethyl glyoxime. Among these, α-(methylsulfonyloxyimino)-p-methoxyphenylacetonitrile and bis-O-(n-butylsulfonyl)-α-dimethyl glyoxime are preferable.

Among the diazomethane-based acid generators, specific examples of the bisalkyl or bisarylsulfonyldiazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane and bis(2,4-dimethylphenylsulfonyl)diazomethane.

Examples of the poly(bissulfonyl)diazomethanes include those having the following structures, for example, 1,3-bis(phenylsulfonyldiazomethylsulfonyl)propane (compound A, decomposition point: 135° C.), 1,4-bis(phenylsulfonyldiazomethylsulfonyl)butane (compound B, decomposition point: 147° C.), 1,6-bis(phenylsulfonyldiazomethylsulfonyl)hexane (compound C, melting point: 132° C., decomposition point: 145° C.), 1,10-bis(phenylsulfonyldiazomethylsulfonyl)decane (compound D, decomposition point: 147° C.), 1,2-bis(cyclohexylsulfonyldiazomethylsulfonyl)ethane (compound E, decomposition point: 149° C.), 1,3-bis(cyclohexylsulfonyldiazomethylsulfonyl)propane (compound F, decomposition point: 153° C.), 1,6-bis(cyclohexylsulfonyldiazomethylsulfonyl)hexane (compound G, melting point: 109° C., decomposition point: 122° C.) and 1,10-bis(cyclohexylsulfonyldiazomethylsulfonyl)decane (compound H, decomposition point: 116° C.).

COMPOUND A

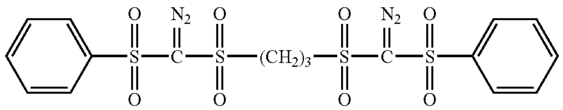

COMPOUND B

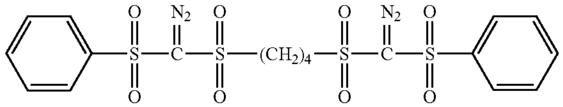

COMPOUND C

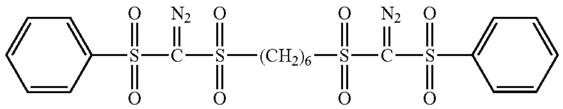

COMPOUND D

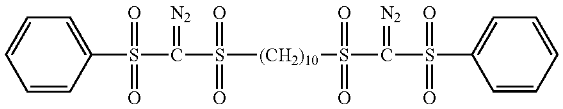

COMPOUND E

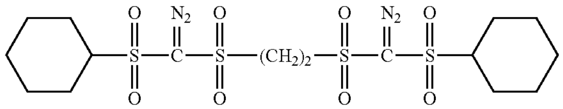

COMPOUND F

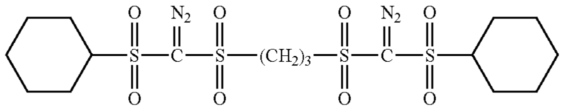

COMPOUND G

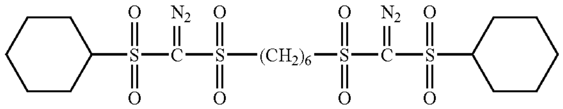

COMPOUND H

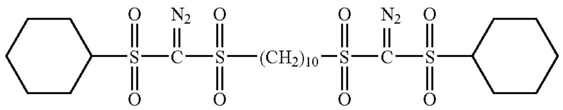

These acid generators may be used alone or in combination as the component (B).

In the present invention, the onium salt-based acid generator and/or the diazomethane-based acid generator are preferable. The onium salt-based acid generator is preferably used in combination with the diazomethane-based acid generator in the content of 10 to 80% by weight based on the weight of the onium salt-based acid generator because line edge roughness in the contact hole decreases.

In the present invention, the component (B) preferably contains an onium salt-based acid generator containing a perfluoroalkyl sulfonate having 3 to 4 carbon atoms as an anion (which hereinafter may be abbreviated to C3-4 onium salt), because mask linearity is improved and patterns having various sizes, which are faithful to the mask, can be realized. Also the resulting patterns are excellent in proximity effect, DOF and exposure margin. The alkyl group of the perfluoroalkyl sulfonate may be linear or branched, but is preferably linear.

In the case of mixing the C3-4 onium salt as the component (B), the content of the C3-4 onium salt in the component (B) is preferably from 50 to 100% by weight.

In the case of mixing the C3-4 onium salt as the component (B), it is preferred to use in combination with an onium salt-based acid generator containing a perfluoroalkyl sulfonate having 1 carbon atom as an anion (which hereinafter may be abbreviated to C1 onium salt).

The content of the component (B) is from 0.5 to 30 parts by weight, and preferably from 1 to 10 parts by weight, based on 100 parts by weight of the component (A). When the content is less than the above range, a pattern may not be sufficiently formed. On the other hand, when the content is more than the above range, a uniform solution may not be obtained with ease and thus storage stability may be lowered.

(Component (C))

The positive resist composition of the present invention can optionally contain, in addition to the essential components (A) and (B), a low molecular weight dissolution inhibitor (C) having an acid dissociable dissolution inhibiting group, the acid dissociable dissolution inhibiting group being dissociated by an action of an acid (which hereinafter referred to as component (C)). In the case in which the positive resist composition contains, as the component (A), an alkali soluble resin component (A2) such as silsesquioxane resin (A21), it is necessary to mix with the component (C). Mixing with the component (C) can improve rectangularity, definition and line edge roughness of the pattern.

The molecular weight of the component (C) is preferably 3000 or less, and more preferably from 500 to 2000.

As the component (C), there can be used known dissolution inhibitors which have already been used in a chemically amplified positive resist composition, and examples thereof include a phenol compound having a phenolic hydroxyl group protected with an acid dissociable dissolution inhibiting group, and a carboxyl compound having a carboxyl group protected with an acid dissociable dissolution inhibiting group. As used herein, "protected" means that at least one hydroxyl group of the phenolic hydroxyl group and the carboxyl group is substituted with an acid dissociable dissolution inhibiting group.

Examples of the phenol compound having a phenolic hydroxyl group, which can constitute the component (C) by being protected with the acid dissociable dissolution inhibiting group, include polyphenol compounds having 3 to 5 phenol groups, for example, triphenylmethane-based compound bis(phenylmethyl)diphenylmethane-based compound and 1,1-diphenyl-2-biphenylethane-based compound, each having a hydroxyl group as a nucleus substitution group. Also di- to hexanuclear compounds obtained by formalin condensation of at least one phenol selected from among phenol, m-cresol, 2,5-xylenol can be used.

Examples of the carboxyl compound having a carboxyl group, which can constitute the component (C) by being protected with the acid dissociable dissolution inhibiting group, include biphenylcarboxylic acid, naphthalene(di)carboxylic acid, benzoylbenzoic acid and anthracenecarboxylic acid.

Examples of the acid dissociable dissolution inhibiting group for protecting the hydroxyl group or the carboxyl group in these phenol compounds or carboxyl compounds include tertiary butyloxycarbonyl groups such as tertiary butyloxycarbonyl group and tertiary amyloxycarbonyl group; tertiary alkyl groups such as tertiary butyl group and tertiary amyl group; tertiary alkoxycarbonylalkyl groups such as tertiary butyloxycarbonylmethyl group and tertiary amyloxycarbonylmethyl group; and cyclic ether groups such as tetrahydropyranyl group and tetrahydroalanyl group.

Preferable compounds as the component (C) is produced by protecting a tetranuclear compound, obtained by condensing 2,5-xylenol with a formalin condensate, with a tertiary alkoxycarbonylalkyl group.

These components (C) may be used alone or in combination.

The content of the component (C) in the positive resist composition of the present invention is preferably from 0.5 to 40 parts by weight, and more preferably from 10 to 30 parts by weight, based on 100 parts by weight of the component (A). When the content is less than 0.5 parts by weight, sufficient dissolution inhibiting effect may not be obtained. On the other hand, when the content is more than 40 parts by weight, the pattern shape may become worse or lithography characteristics may become worse, and therefore it is not preferred.

(Component (D))

The positive resist composition of the present invention can further contain, as an optional component, a nitrogen-containing organic compound (D) (which hereinafter referred to as a component (D)) so as to improve resist pattern shape and post-exposure stability of the latent image formed by the patternwise exposure of the resist layer.

Since various compounds have already been proposed as the component (D), it may be appropriately selected from known compounds. Among these compounds, amine, particularly secondary lower aliphatic amine and tertiary lower aliphatic amine are preferable.

As used herein, the term "lower aliphatic amine" refers to an amine of an alkyl or alkyl alcohol having 5 or less carbon atoms, and examples of the secondary or tertiary amine include trimethylamine, diethylamine, triethylamine, di-n-propylamine, tri-n-propylamine, tripentylamine, diethanolamine and triethanolamine. Among these, tertiary alkanolamines such as triethanolamine are preferable.

These amines may be used alone or in combination.

The component (D) is usually used within a range from 0.01 to 5.0 parts by weight based on 100 parts by weight of the component (A).

(Component (E))

The positive resist composition of the present invention can further contain, as an optional component, an organic carboxylic acid or oxo acid of phosphorus or its derivative (E) (which hereinafter referred to as a component (E)) so as to prevent deterioration of sensitivity due to mixing with the component (D) and to improve resist pattern shape and post-exposure stability of the latent image formed by the patternwise exposure of the resist layer. The component (D) and the component (E) can be used alone or in combination.

The organic carboxylic acid is preferably malonic acid, citric acid, malic acid, succinic acid, benzoic acid or salicylic acid.

Examples of the oxo acid of phosphorus or its derivative include phosphoric acid or its derivatives such as esters, for example, phosphoric acid, phosphoric acid di-n-butyl ester or phosphoric acid diphenyl ester; phosphonic acid or its derivatives such as esters, for example, phosphonic acid, phosphonic acid dimethyl ester, phosphonic acid-di-n-butyl ester, phenylphosphonic acid, phosphonic acid diphenyl ester or phosphonic acid dibenzyl ester; and phosphinic acid or its derivative such as an ester, for example, phosphinic acid or phenylphosphinate. Among these, phosphonic acid is preferable.

The content of the component (E) is from 0.01 to 5.0 parts by weight based on 100 parts by weight of the component (A).

(Other Optional Components)

If necessary, the positive resist composition of the present invention can further contain miscible additives, for example, additive resins for improving performances of the resist film, surfactants for improving coatability, dissolution inhibitors, plasticizers, stabilizers, colorants and antihalation agents.

(Organic Solvent)

The positive resist composition of the present invention can be produced by dissolving the above-mentioned materials such as components (A) and component (B) in an organic solvent.

The organic solvent may be any one which can dissolve the respective components to form a uniform solution, and one or more kinds of any organic solvents can be appropriately selected from those which have conventionally been known as the solvent for a chemically amplified resist.

Examples thereof include γ-butyrolactone; ketones such as acetone, methyl ethyl ketone, cyclohexanone, methyl isoamyl ketone and 2-heptanone; polyhydric alcohols and derivatives thereof, such as ethylene glycol, ethylene glycol monoacetate, diethylene glycol, diethylene glycol monoacetate, propylene glycol, propylene glycol monoacetate, and monomethyl ether, monoethyl ether, monopropyl ether, monobutyl ether or monophenyl ether of dipropylene glycol or dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate and ethyl ethoxypropionate.

These organic solvents may be used alone or in combination.

In the present invention, a solvent mixture of propylene glycol monomethyl ether (PGME) and a solvent having a boiling point higher than that of PGME is preferably used. Consequently, resist pattern shape such as line edge roughness or line width roughness (non-uniformity of width of line) is improved. Also depth of focus (DOF) in a contact hole is widened.

The solvent having a boiling point higher than that of PGME is preferably a solvent having a boiling point higher than 120° C. as the boiling point of PGME, more preferably a solvent having a boiling point which is at least 20° C. higher than that of PGME, and still more preferably a solvent having a boiling point which is at least 25° C. higher than that of PGME. The upper limit of the boiling point is not specifically limited, but is preferably about 200° C. or lower. Examples of the solvent include propylene glycol monomethyl ether acetate (boiling point: 146° C.), EL (boiling point: 155° C.) and γ-butyrolactone (boiling point: 204° C.). Among these solvents, EL is preferable.

The content of PGME in the solvent mixture is preferably from 10 to 60% by weight, and more preferably from 20 to 40% by weight, based on the entire solvent mixture. When the content is within the above range, excellent effects are exerted.

The content of the organic solvent is not specifically limited and is appropriately set to the content, which enables application of the resulting coating solution onto the substrate, according to the thickness of the coating film. It is preferably set so that the solid content of the resist composition is within a range from 2 to 20% by weight, and preferably from 5 to 15% by weight.

When using a solvent mixture of PGME and a high-boiling point solvent as the organic solvent, since a rigid film can be formed in the case of small solid content of the resin, the solid content can be decreased and thus a film having sufficient etching resistance can be obtained.

(Method for Formation of Lift-Off Pattern and Patterning Method)

The positive resist composition of the present invention can be preferably used for a method for formation of a lift-off pattern, and a patterning method of a substrate or a magnetic film provided on the substrate using the lift-off pattern.

The method for formation of a lift-off pattern and the patterning method using the positive resist composition of the present invention will now be described in more detail by way of embodiments applied to the production of a lead of a magnetic head with reference to FIGS. 1A to 1E. FIGS. 1A to FIG. 1E are schematic views (side cross-sectional views) showing the respective steps of this embodiment.

"Method for Formation of Lift-Off Pattern"

(Step of Forming Magnetic Film 2')

First, as shown in FIG. 1A, a magnetic film 2' is formed on a substrate 1 such as silicon wafer using a sputtering apparatus.

The substrate is not specifically limited and conventionally known one can be used. For example, substrates for electronic components can be exemplified. Examples of the material of the substrate include metals such as silicon wafer, copper, chromium, iron and aluminum; and glass.

As the magnetic material used as the magnetic film 2', those containing elements such as Ni, Co, Cr and Pt can be used.

(Step of Forming Base Film 3')

Then, a resist composition or resin solution for formation of a base film is applied on the magnetic film 2' thus formed, using a spinner, and subjected to a baking treatment under heating conditions of a temperature of 200 to 300° C. for 30 to 300 seconds, and preferably 60 to 180 seconds to form a base film 3'.

The base film is an organic film which is insoluble in an alkali developer solution used in the development after exposure, and is etchable by a conventional dry etching method.

By using such a base film 3', as described hereinafter, only a resist film 4' is subjected to exposure and alkali development by conventional photolithography to form a resist pattern 4, and then the resist pattern 4 is transferred by dry etching of the base film 3' using the resist pattern 4 as a mask to form a base pattern 3 on the base film 3'.

The material for formation of the base film 3' does not necessarily have the photoactivity of the resist film 4', and a resist or resin used generally as a base material may be used in the production of semiconductor devices and light crystal display devices.

Since the resist pattern 4 must be transferred to the base film 3', the base film 3' is preferably a material which can be etched by oxygen plasma.

As such a material, those containing at least one selected from the group consisting of novolak resin, acrylic resin and soluble polyimide as a main component is preferably used because they are easily etched by oxygen plasma and are excellent in resistance to a fluorocarbon gas used for etching of the substrate such as silicon in the post-process, and resistance to ionic etching such as ion milling used for etching of the magnetic film.

Among these materials, a novolak resin, and an acrylic resin having an alicyclic moiety or an aromatic ring in the side chain is preferably used because it is inexpensive and are widely used, and are also excellent in dry etching resistance in the post-process.

As the novolak resin, those used generally in the positive resist composition can be used, and also a positive resist for i-rays or g-rays, containing a novolak resin as a main component can be used.

The novolak resin is obtained by addition condensation of an aromatic compound having a phenolic hydroxyl group (which hereinafter referred to simply as "phenols") and aldehydes in the presence of an acid.

Examples of phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinonemonomethyl ether, pyrogallol, fluoroglycinol, hydroxydiphenyl, bisphenol A, gallic acid, gallate ester, α-naphthol and β-naphthol.

Examples of aldehydes include formaldehyde, furfural, benzaldehyde, nitrobenzaldehyde and acetaldehyde.

Although the catalyst used in the addition condensation reaction is not specifically limited, hydrochloric acid, nitric acid, sulfuric acid, formic acid, oxalic acid and acetic acid may be used as the acid catalyst.

The weight average molecular weight of the novolak resin is preferably within a range from 5000 to 50000, more preferably from 6000 to 9000, and still more preferably from 7000 to 8000. When the weight average molecular weight is less than 5000, the novolak resin may cause sublimation when baked at high temperature. On the other hand, when the weight average molecular weight is more than 50000, it may become impossible to perform dry etching, and therefore it is not preferred.

The novolak resin, which can be used in the present invention, is commercially available and is preferably a novolak resin which has a content of a low molecular weight component having a molecular weight of 500 or less, preferably 200 or less, of 1% by weight or less, preferably 0.8% by weight or less, determined using gel permeation chromatography. The smaller the content of the low molecular weight component, the better. The content is preferably 0% by weight.

The "low molecular weight component having a molecular weight of 500 or less" is detected as a low-molecular fraction having a molecular weight of 500 or less when analyzed by a GPC method using polystyrene standards. The "low molecular weight component having a molecular weight of 500 or less" include a non-polymerized monomer, and those having low polymerization degree, for example, those obtained by condensing 2 to 5 molecules of phenols with aldehydes, although this varies depending on the molecular weight.

The content (% by weight) of the low molecular weight component having a molecular weight of 500 or less is measured by plotting a fraction number (abscissa) versus a concentration (ordinate) of the analysis results obtained by the GPC method to form a graph, and determining a ratio (%) of the area under the curve of the low molecular weight component having a molecular weight of 500 or less to the entire area under the curve.

With respect to the meaning and the method for measurement of the content of the "low molecular weight component having a molecular weight of 200 or less", "500" may be replaced by "200" in the meaning and the method for measurement of the content of the "low molecular weight component having a molecular weight of 500 or less"

By adjusting Mw of the novolak resin to 50000 or less, excellent embedding into a substrate having fine irregularity is attained. By adjusting Mw of the novolak resin to 5000 or more, etching resistance to a fluorocarbon gas is obtained, and therefore it is preferred.

When the content of the low molecular weight component having a molecular weight of 500 or less is 1% by weight or less, excellent embedding into a substrate having fine irregularity is attained. The reason is not clear but is believed to be that the dispersion degree decreases.

As the acrylic resin, there can be used those which are generally used in the positive resist composition. The acrylic resin includes, for example, an acrylic resin including a constituent unit derived from a polymerizable compound having an ether bond, and a constituent unit derived from a polymerizable compound having a carboxyl group.

Examples of the polymerizable compound having an ether bond include (meth)acrylic acid derivatives having an ether bond and an ester bond, such as 2-methoxyethyl(meth)acrylate, methoxytriethylene glycol(meth)acrylate, 3-methoxybutyl(meth)acrylate, ethylcarbitol(meth)acrylate, phenoxypolyethylene glycol(meth)acrylate, methoxypolypropylene glycol(meth)acrylate and tetrahydrofurfuryl(meth)acrylate. These compounds can be used alone or in combination.

Examples of the polymerizable compound having a carboxyl group include monocarboxylic acids such as acrylic acid, methacrylic acid and crotonic acid; dicarboxylic acids such as maleic acid, fumaric acid and itaconic acid; and compounds having a carboxyl group and an ester bond, such as 2-methacryloyloxyethylsuccinic acid, 2-methacryloyloxyethylmaleic acid, 2-methacryloyloxyethylphthalic acid and 2-methacryloyloxyethylhexahydrophthalic acid. Among these compounds, acrylic acid and methacrylic acid are preferable. These compounds can be used alone or in combination.

The soluble polyimide is a polyimide which can be formed into liquid by using the organic solvent described above.

(Step of Forming Resist Film 4')

A solution of the positive resist composition of the present invention is applied on the lower layer film 3' using a spinner and is then subjected to prebaking (PAB treatment) to form a resist film 4', and thus obtaining a laminate including a base film 3' and a resist film 4' made of the positive resist composition of the present invention formed on the magnetic film 2' on the substrate 1.

The prebaking conditions vary depending on the kind and amount of the respective components in the composition, and the thickness of the coating film. The prebaking is usually conducted at 70 to 150° C., and preferably 80 to 140° C., for about 0.5 to 60 minutes.

An organic or inorganic anti-reflection film may be provided between the base film and the resist film.

In the resist laminate of the present invention, in view of throughput balance taking account of the objective aspect ratio and the time required to dry etching of the base film 3', the total thickness of the base film 3' and the resist film 4' is preferably 15 μm or less, and more preferably 5 μm or less. The lower limit of the total thickness is not specifically limited, but is preferably 0.1 μm or more, and more preferably 0.35 μm or more.

The thickness of the base film 3' is preferably from 20 to 10000 nm, more preferably from 30 to 5000 nm, and still more preferably from 30 to 3000 nm. By adjusting the thickness of the base film 3' within the above range, there can be exerted such effects that a resist pattern having a high aspect ratio can be formed and sufficient etching resistance can be secured when the substrate is etched.

The thickness of the resist film 4' is preferably within a range from 50 to 1000 nm, more preferably from 100 nm to 800 nm, and still more preferably from 100 to 500 nm. By adjusting the thickness of the resist film 4' within the above range, there can be exerted such effects that a resist pattern 4 can be formed with high resolution and sufficient etching resistance to an alkali developer solution and ionic etching can be obtained.

In the resist laminate having a resist pattern, a pattern having a high aspect ratio is preferably formed without causing pattern falling. As the resulting pattern has a higher aspect ratio, a fine pattern can be formed on a support described below with higher accuracy.

As used herein, the aspect ratio refers to a ratio of the height y of the base pattern 3 to the pattern width x of the resist pattern, (y/x). The pattern width x of the resist pattern is the same as the width of the base pattern 3 transferred to the base pattern 3.

As used herein, the pattern width refers to the width of the line when the resist pattern is a line-shaped pattern such as line-and-space pattern or isolated line pattern.

When the resist pattern is a hole pattern, the pattern width refers to an inner diameter of a hole formed.

When the resist pattern is a cylindrical dot pattern, the pattern width refers to a diameter. Any of these pattern widths is the width of the lower portion of the pattern.

According to the positive resist composition of the present invention, a pattern having a high aspect ratio can be easily formed. In the case of a dot pattern or Iso line pattern, it is possible to form a dot pattern or Iso line pattern having an aspect ratio of not less than 8 and not more than 20, which cannot be attained by a conventional resist composition, to the base pattern 3 having a thickness of 2.5 μm. In the case of a trench pattern, it is possible to form a trench pattern having an aspect ratio of not less than 10 and not more than 20, which cannot be attained by a conventional resist composition, to the base pattern 3 having a thickness of 2.5 μm. In both cases, the limitation of the aspect ratio is about 5 when using a conventional resist composition.

(Step of Forming Resist Pattern)

Then, the resist film 4' is selectively exposed via a desired mask pattern. The wavelength of radiations used during exposure is not specifically limited, and exposure can be conducted by using radiations such as from an ArF excimer laser, a KrF excimer laser, an $F_2$ excimer laser, an EUV (extreme ultraviolet ray), a VUV (vacuum ultraviolet ray), an EB (electron beam), an X-ray and a soft X-ray. The photoresist composition of the present invention is particularly effective for KrF excimer lasers and EB (electron beam). When using EB, selective irradiation with electron beam via a mask, or drawing may be carried out.

After the completion of the exposure step, PEB (post-exposure baking) is conducted.

The PEB conditions vary depending on the kind and amount of the respective components in the composition, and the thickness of the coating film. The prebaking is usually conducted at 70 to 150° C., and preferably 80 to 140° C., for about 0.5 to 60 minutes.

Figure 1B:
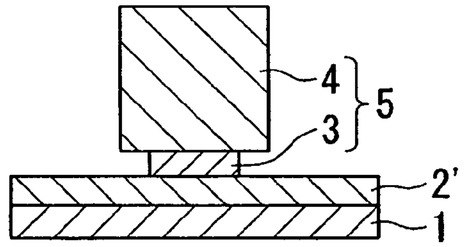

Subsequently, when subjected to a developing treatment using an alkali developer solution made of an aqueous alkali solution, for example, an aqueous tetramethylammonium hydroxide solution having a concentration of 0.05 to 10% by weight, and preferably 0.05 to 3% by weight, a predetermined range (exposed area) of the resist film 4' is developed to obtain a resist pattern 4 as shown in FIG. 1B.

(Step of Over-Etching)

Using the resulting resist pattern 4 as a mask pattern, dry etching of the base film 3' is conducted to form a base pattern 3 on a base film 3'.

At this time, when over-etching of the base film 3' is conducted, the base film 3'located under the resist pattern 4 is also removed and only the lower portion in the vicinity of the center of the resist pattern 4 is remained. Consequently, a lift-off pattern 5 having a battledore-shaped profile including a base pattern 3 having a small width $W_1$ of the base film 3' and a resist pattern 4 having a larger width $W_2$ of the resist film 4', as shown in FIG. 1B, can be obtained.

In the present invention, as described above, since dry etching can be utilized for over-etching in the case of forming the lift-off pattern 5, it is made possible to finely control the size as compared with a conventional method of using an alkali development. Therefore, the width $W^1$ of the base pattern can be controlled to about 40 nm.

As the dry etching method, there can be used known methods, for example, chemical etching methods such as downflow etching and chemical dry etching; physical etching methods such as spatter etching and ion beam etching; and chemical and physical etching methods such as RIE (reactive ion etching).

Most popular dry etching method is a parallel-plate RIE method. According to this method, a resist laminate is placed in a chamber of an RIE system and a required etching gas is introduced. When a high frequency voltage is applied to a holder of the resist laminate disposed in parallel to an upper electrode in the chamber, the gas is converted into plasma. In the plasma, charge particles such as positive or negative ions or electrons, and neutral active species exist. When these etching species are adsorbed onto the lower organic layer, a chemical reaction occurs and the reaction product is eliminated from the surface and then discharged, and thus etching proceeds.

Examples of the etching gas include oxygen gas and sulfur dioxide gas. Among these etching gasses, oxygen gas is preferably used because the etching with oxygen plasma secures high resolution, and also the silsesquioxane resins (A11), (A12) and (A21) of the present invention show high etching resistance to oxygen plasma and is widely used.

"Patterning Method"

(Step of Ionic Etching of Magnetic Film 2')

Using the lift-off pattern 5 thus obtained, a lead portion of a magnetic head is produced.

Figure 1C:
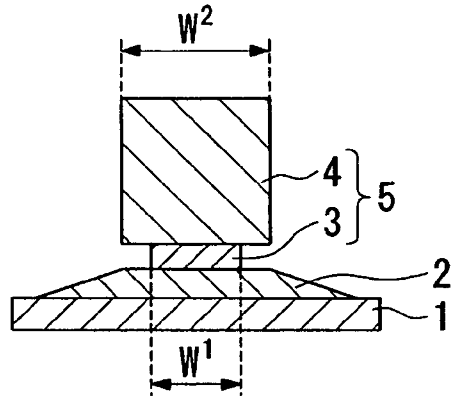

When ionic etching is conducted using the lift-off pattern 5 having a tapered shape including the resist pattern 4 and the base pattern 3 shown in FIG. 1B as a mask, the magnetic film 2' in the vicinity of the lift-off pattern 5 is etched, and thus the magnetic film 2' at the lower portion of the lift-off pattern 5 remains and a magnetic film pattern 2 is printed, as shown in FIG. 1C.

Examples of the ionic etching include anisotropic etching such as ion milling. A conventionally known method can be applied to ion milling. For example, ion milling can be conducted by using an ion beam milling apparatus IML series, manufactured by Hitachi, Ltd.

(Sputtering Step)

Figure 1D:
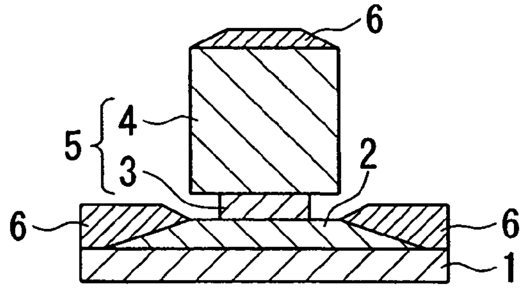

When sputtering is further conducted, as shown in FIG. 1D, an electrode film 6 is formed on the lift-off pattern 5, and also formed on the substrate 1 around the magnetic film pattern 2.

A conventionally known method can be applied to sputtering. For example, sputtering can be conducted by using a sputtering apparatus ISM-2200 or ISP-1801, manufactured by Hitachi, Ltd.

(Lift-Off Step)

Figure 1E:
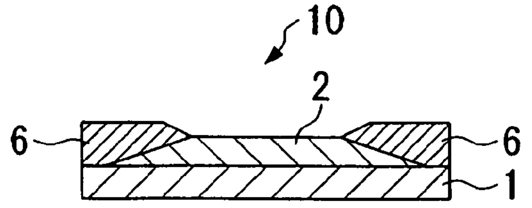

Finally, when base pattern 3 is etched by dry etching to remove (lift-off) the lift-off pattern 5, a lead portion 20 of a magnetic head including a substrate 1, a magnetic film pattern 2 formed on the substrate, and electrode films 6 formed around the substrate, as shown in FIG. 1E, is produced.

In the above embodiment, a laminate for production of a magnetic head, including a substrate 1 and a magnetic film 2 laminated on the substrate was described; however, the present invention is not limited thereto. The positive resist composition of the present invention can be preferably used for all applications wherein a lift-off pattern is formed, including applications wherein no magnetic film is provided, for example, production of MRAM (Magnetic Random Access Memory) and MEMS (Micro Electro Mechanical Systems).

As described above, a fine lift-off pattern can be formed by using the positive resist composition of the present invention. The lift-off pattern thus obtained is less likely to cause pattern falling because the profile of the resist pattern portion is excellent in rectangularity, and is also excellent in definition.

EXAMPLES

The present invention will now be described by way of examples, but the scope of the present invention is not limited to the following examples.

Synthesis Example 1

Synthesis Example of Silsesquioxane Resin (A11)

In a 500 ml three-necked flask equipped with a stirrer, a reflux condenser, a dropping funnel and a thermometer, 84.0 g (1.0 mol) of sodium hydrogencarbonate and 400 ml of water were charged and a mixed solution of 51.1 g (0.20 mol) of p-methoxybenzyltrichlorosilane, 21.1 g (0.10 mol) of phenyltrichlorosilane and 100 ml of diethyl ether was added dropwise over 2 hours from a dropping funnel, followed by aging for one hour. After the completion of the reaction, the reaction mixture was extracted with ether and ether was distilled off under reduced pressure. To the resulting hydrolysate, 0.2 g of a 10 wt % solution of potassium hydroxide was added, followed by heating at 200° C. for 2 hours to obtain a copolymer $A_1$ of p-methoxybenzylsilsesquioxane and phenylsilsesquioxane.

Then, 50 g of the resulting copolymer $A_1$ was dissolved in 150 ml of acetonitrile and 80 g (0.40 mol) of trimethylsilyliodine was added. After stirring under reflux for 24 hours, 50 ml of water was added and the solution was reacted by stirring under reflux for 12 hours. After cooling, free iodine was reduced with an aqueous sodium hydrogensulfite solution and the organic layer separated. After the solvent was distilled off under reduced pressure, the resulting polymer was reprecipitated from acetone and n-hexane and then dried with heating under reduced pressure to obtain a copolymer $A_2$ including 70% by mole of p-hydroxybenzylsilsesquioxane and 30% by mole of phenylsilsesquioxane.

Then, 40 g of the resulting copolymer $A_2$ was dissolved in 200 ml of tetrahydrofuran (THF) and 1.0 g of p-toluenesulfonic acid monohydrate as the acid catalyst and 5.0 g of ethyl vinyl ether were added, and the mixture was reacted under the conditions of a temperature of 23° C. for about 3 hours. While stirring, the reaction solution was poured into water to deposit a polymer to obtain 40 g of a silsesquioxane resin (X1) represented by the following chemical formula (IX). In the formula, 1:m:n=50% by mole:20% by mole:30% by mole, and the weight average molecular weight of the resin is 7500. The dispersion degree was about 1.7.

(IX)

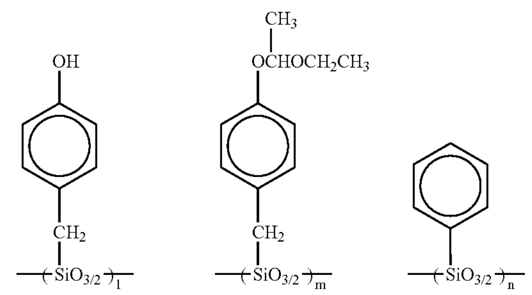

Synthesis Example 2

Synthesis Example of Silsesquioxane Resin (A12)

In a 500 ml three-necked flask equipped with a stirrer, a reflux condenser, a dropping funnel and a thermometer, 84.0 g (1.0 mol) of sodium hydrogencarbonate and 400 ml of water were charged and a mixed solution of 51.1 g (0.20 mol) of p-methoxybenzyltrichlorosilane, 21.1 g (0.10 mol) of phenyltrichlorosilane and 100 ml of diethyl ether was added dropwise over 2 hours from a dropping funnel, followed by aging for one hour. After the completion of the reaction, the reaction mixture was extracted with ether and ether was distilled off under reduced pressure. To the resulting hydrolysate, 0.2 g of a 10 wt % solution of potassium hydroxide was added, followed by heating at 200° C. for 2 hours to obtain a copolymer $A_1$ of p-methoxybenzylsilsesquioxane and phenylsilsesquioxane.

Then, 50 g of the resulting copolymer $A_1$ was dissolved in 150 ml of acetonitrile and 80 g (0.40 mol) of trimethylsilyliodine was added. After stirring under reflux for 24 hours, 50 ml of water was added and the solution was reacted by stirring under reflux for 12 hours. After cooling, free iodine was reduced with an aqueous sodium hydrogensulfite solution and the organic layer separated. After the solvent was distilled off under reduced pressure, the resulting polymer was reprecipitated from acetone and n-hexane and then dried with heating under reduced pressure to obtain a copolymer $A_2$ including 70% by mole of p-hydroxybenzylsilsesquioxane and 30% by mole of phenylsilsesquioxane.

Then, 40 g of the resulting copolymer $A_2$ was dissolved in 200 ml of tetrahydrofuran (THF) and 1.0 g of p-toluenesulfonic acid monohydrate as the acid catalyst and 6.5 g of cyclohexyl vinyl ether were added, and the mixture was reacted under the conditions of a temperature of 23° C. for about 3 hours. While stirring, the reaction solution was poured into water to deposit a polymer to obtain 40 g of a silsesquioxane resin (X2) represented by the following chemical formula (X). In the formula, 1:m:n=55% by mole: 15% by mole:30% by mole, and the weight average molecular weight of the resin is 7600.

(X)

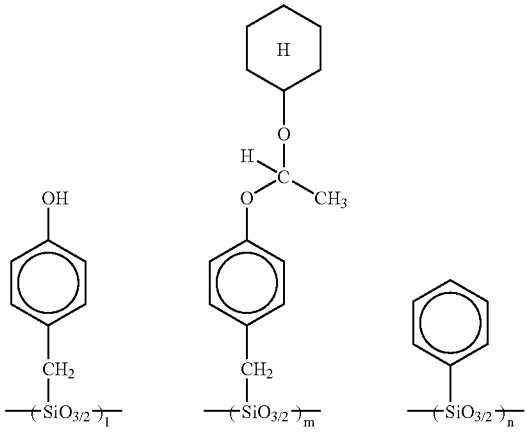

Example 1

100 Parts by weight of the silsesquioxane resin (X1) obtained in Synthesis Example 1 was dissolved in 950 parts by weight of ethyl lactate and then 3 parts by weight of triphenylsulfonium trifluoromethane sulfonate, 2 parts by weight of bis(cyclohexylsulfonyl)diazomethane and 0.25 parts by weight of triethanolamine were added to prepare a positive resist composition (silicon content (Si content) is 16.20% by weight based on the entire solid content).

TBLC-100 (manufactured by Tokyo Ohka Kogyo Co., Ltd.) as a base film material was applied onto a silicon substrate using a spinner, and then subjected to a baking treatment at 230° C. for 90 seconds to form a base film having a thickness of 2500 nm.

The positive resist composition obtained previously was applied onto the base film using a spinner, subjected to a baking treatment at 95° C. for 90 seconds and then dried to form a resist film having a thickness of 300 nm.

Then, the resist film was selectively irradiated with a KrF excimer laser (248 nm) via a halftone type (transmittance:

6%) mask pattern using a KrF aligner NSR-S203B (manufactured by Nikon Corporation; NA (numerical aperture) =0.68, σ=0.75).

The resist film was subjected to a PEB treatment under the conditions of a temperature of 95° C. for 90 seconds, and then subjected to a development treatment with an aqueous 2.38% wt % tetramethylammonium hydroxide solution at 23° C. for 60 seconds to obtain an Iso line pattern (I) having a thickness of 250 nm.

To this Iso line pattern (I), an Iso line pattern (II) was transferred to a base film by dry etching by an oxygen plasma using a high-vacuum RIE apparatus (manufactured by Tokyo Ohka Kogyo Co., Ltd.) to obtain a lift-off pattern including the Iso line pattern (II) having a line width of 250 nm and a thickness of 2500 nm.

The resulting pattern was excellent in rectangularity and had an aspect ratio of 10. In the same manner as described above, a dot pattern having a thickness of 300 nm was formed and subjected to dry etching to obtain a dot pattern (II)' having a line width of 300 nm and a thickness of 2500 nm (aspect ratio: 8.3). The resulting patterns (II) and (II)' were fine patterns which are excellent in rectangularity and also have a high aspect ratio.

Example 2

100 Parts by weight of the silsesquioxane resin (X2) obtained in Synthesis Example 2 was dissolved in 950 parts by weight of ethyl lactate and then 3 parts by weight of triphenylsulfonium trifluoromethane sulfonate, 0.3 parts by weight of triethanolamine and 15 parts by weight of a low molecular weight dissolution inhibitor (DI22) represented by the following formula (XI) were added to prepare a positive resist composition:

(XI)

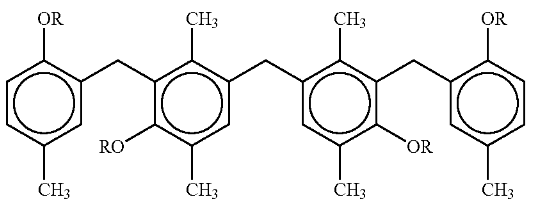

R represents a —$CH_2$COO-tert-butyl group.

In the same manner as in Example 1, a pattern was formed by using the resulting positive resist composition and a base film was etched to obtain an Iso line pattern (aspect ratio: 10) having a line width of 250 nm and a thickness of 2500 nm and a dot pattern (aspect ratio: 8.3) having a line width of 300 nm and a thickness of 2500 nm. The resulting patterns were fine patterns which are excellent in rectangularity and also have a high aspect ratio.

Comparative Example 1

100 Parts by weight of a copolymer including hydroxystyrene/styrene/tert-butyl acrylate (molar ratio: 66.5/8.5/25), 2 parts by weight of bis(tert-butylphenyl)iodonium nonafluorobutane sulfonate as the acid generator, 0.07 parts by weight of triethylamine and 0.09 parts by weight of salicylic acid were dissolved in 300 parts by weight of a solvent mixture (weight ratio: 2:8) of propylene glycol monomethyl ether acetate and propylene glycol monomethyl ether to prepare a positive resist composition.

The positive resist composition obtained previously was applied onto a silicon substrate using a spinner, subjected to a baking treatment at 130° C. for 150 seconds and then dried to form a resist film having a thickness of 2500 nm.

Then, the resist film was selectively irradiated with KrF excimer laser (248 nm) via a mask pattern using a KrF aligner EPA3000EX3 (manufactured by Canon Inc.; NA (numerical aperture)=0.55, σ=0.55).

The resist film was subjected to a PEB treatment under the conditions of a temperature of 120° C. for 150 seconds, and then subjected to a development treatment with an aqueous 2.38% wt % tetramethylammonium hydroxide solution at 23° C. for 120 seconds to obtain an Iso line pattern (aspect ratio: 4.4) having a thickness of 563 nm.

Example 3

100 Parts by weight of the silsesquioxane resin (X1) obtained in Synthesis Example 1, 8 parts by weight of bis-O-(n-butylsulfonyl)-α-dimethyl glyoxime, 0.4 parts by weight of triphenylsulfonium nonafluorobutane sulfonate, 1.5 parts by weight of trioctylamine and 4 parts by weight of a low molecular weight dissolution inhibitor (DI22) represented by the above formula (XI) were dissolved in 950 parts by weight of propylene glycol monomethyl ether acetate to prepare a positive resist composition (Si content: 16.2%).

The positive resist composition was applied onto a 8 inch silicon substrate subjected to a hexamethylsilazane treatment or a 8 inch silicon substrate coated with a lower layer film made of a material based on a novolak resin. Then, the substrate was subjected to a baking treatment at 90° C. for 90 seconds to obtain a resist film having a thickness of 300 nm. The substrate was subjected to a drawing treatment by an EB Lithography System (HL-800D manufactured by Hitachi High-Technologies Corporation, acceleration voltage: 70 kV), subjected to a baking treatment at 100° C. for 90 seconds, developed with a 2.38% TMAH solution for 60 seconds, rinsed with pure water for 30 seconds, subjected to shake-off drying and then subjected to a baking treatment at 100° C. for 60 seconds. According to this treatment, there could be obtained a resist pattern wherein a L&S pattern has a thickness of 150 nm and a Dot pattern has a thickness of 150 nm.

Using the resist pattern as a mask, a 2500 nm thick lower layer film made of a material based on a novolak resin was etched to form a 2500 nm thick lift-off pattern wherein a L&S pattern has a thickness of 150 nm and a Dot pattern has a thickness of 150 nm.

The resulting L&S and dot patterns were fine patterns which are exellent in rectangularity and also have a high aspect ratio of 16.7.

Example 4

In the same manner as in Example 1, except that the silsesquioxane resin (X1) was replaced by 100 parts by weight of the silsesquioxane resin (X2) obtained in Synthesis Example 2, a positive resist composition (Si content: 11.8%) was prepared. In the same manner as in Example 3, a resist pattern was formed. Using the resist pattern as a mask, a 2500 nm thick lower layer film made of a material based on a novolak resin was etched to form a 2500 nm thick lift-off pattern wherein a L&S pattern has a thickness of 150 nm and a dot pattern has a thickness of 150 nm.

The resulting L&S and dot patterns were fine patterns which are excellent in rectangularity and also have a high aspect ratio of 16.7.

In Examples 1 to 4, fine patterns having excellent rectangularity and a high aspect ratio could be formed. The use of this lift-off positive resist composition makes it possible to realize more fine working of semiconductor devices such as MRAM, MEMS and magnetic head.

In Comparative Example 1, a trial of forming a pattern having a high aspect ratio, like the examples, using a conventional resist composition was made without using a method for formation of a lift-off pattern. However, because of a thick resist film, the resulting pattern was inferior in definition and an aspect ratio, and was therefore inferior to the present invention.

Even when using the method for formation of a lift-off pattern, like the examples, a conventional resist composition is inferior in etching resistance, and thus it is obvious to persons skilled in the art that when the pattern is transferred to the lower layer, the resist film does not endure dry etching to cause corrosion of the lower layer film, and thus a pattern having a high aspect ratio cannot be formed. Consequently, a confirmation test was not conducted daringly.

What is claimed is:

1. A lift-off positive resist composition comprising a base resin component (A) and an acid generator component (B) generating an acid under exposure, wherein the base resin component (A) is a silicone resin component (A1) which contains a silsesquioxane resin (A11) comprising a constituent unit (a1) represented by the following general formula (I):

(I)

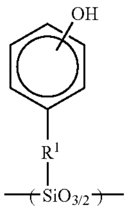

wherein $R^1$ represents a linear or branched alkylene group having 1 to 5 carbon atoms, a constituent unit (a2) represented by the following general formula (II):

(II)

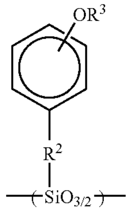

wherein $R^2$ represents a linear or branched alkylene group having 1 to 5 carbon atoms, and $R^3$ represents an acid dissociable dissolution inhibiting group, and a constituent unit (a3) represented by the following general formula (III), (III)

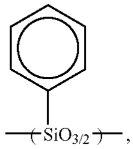, wherein the silicon content is from 5 to 30% by weight based on the total solid content of the lift-off positive resist composition.

2. The lift-off positive resist composition according to claim 1, wherein the total content of the constituent units (a1) and (a2) is 50% by mole or more based on the total amount of all constituent units of the silsesquioxane resin (A11), and the content of the constituent unit (a2) is 8% by mole or more based on the total amount of the constituent units (a1) and (a2).

3. The lift-off positive resist composition according to claim 1, wherein the acid dissociable dissolution inhibiting group is an alkoxyalkyl group.

4. The lift-off positive resist composition according to claim 3, wherein the alkoxyalkyl group is a 1-ethoxyethyl group.

5. The lift-off positive resist composition according to claim 1, which further comprises a low molecular weight dissolution inhibitor (C) having an acid dissociable dissolution inhibiting group, the acid dissociable dissolution inhibiting group being dissociated by an action of an acid.

6. The lift-off positive resist composition according to claim 5, wherein the low molecular weight dissolution inhibitor (C) is a phenol compound having a phenolic hydroxyl group protected with an acid dissociable dissolution inhibiting group, or a carboxyl compound having a carboxyl group protected with an acid dissociable dissolution inhibiting group.

7. The lift-off positive resist composition according to claim 1, wherein the acid generator component (B) is an onium salt-based acid generator and/or a diazomethane-based acid generator.

8. The lift-off positive resist composition according to claim 1, which further comprises a nitrogen-containing organic compound (D).

9. A lift-off positive resist composition comprising a base resin component (A) and an acid generator component (B) generating an acid under exposure, wherein the base resin component (A) is a silicone resin component (A1) which contains a silsesquioxane resin (A12) comprising a constituent unit (a1) represented by the following general formula (I):

(I)

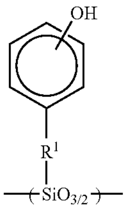

wherein $R^1$ represents a linear or branched alkylene group having 1 to 5 carbon atoms, and a constituent unit (a5) represented by the following general formula (V):

(V)

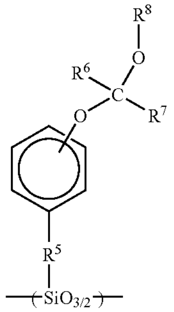

wherein $R^5$ represents a linear or branched alkylene group having 1 to 5 carbon atoms, $R^6$ represents an alkyl group having 1 to 5 carbon atoms, $R^7$ represents an alkyl group having 1 to 5 carbon atoms or a hydrogen atom, and $R^8$ represents an alicyclic hydrocarbon group having 5 to 15 carbon atoms, wherein the silicon content is from 5 to 30% by weight based on the total solid content of the lift-off positive resist composition.

10. The lift-off positive resist composition according to claim 9, wherein the silsesquioxane resin (A12) further comprises a constituent unit (a3) represented by the following general formula (III):

(III)

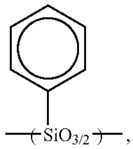

11. The lift-off positive resist composition according to claim 9, wherein the total content of the constituent units (a1) and (a5) is 50% by mole or more based on the total amount of all constituent units of the silsesquioxane resin (A12), and the content of the constituent unit (a5) is 5% by mole or more and 50% by mole or less based on the total amount of the constituent units (a1) and (a5).

12. A method for formation of lift-off pattern comprising producing a laminate including a substrate, a magnetic film on the substrate, a base film on the magnetic film, and a resist film made of the positive resist composition of any one of claims 1, and 2 to 8, on the base film;

selectively exposing the resist film;

developing the resist film to obtain a resist pattern; and dry etching the base film to form a base pattern in the base film, thereby obtaining a lift-off pattern having a battledore-shaped profile including a base pattern having a small width of the base film and a resist pattern having a larger width of the resist film.

* * * * *